United States Patent [19]

Remedi et al.

[11] 4,300,065
[45] Nov. 10, 1981

[54] POWER ON RESET CIRCUIT

[75] Inventors: James J. Remedi; Alan K. Peterson, both of Austin, Tex.

[73] Assignee: Motorola, Inc., Schaumburg, Ill.

[21] Appl. No.: 54,092

[22] Filed: Jul. 2, 1979

[51] Int. Cl.³ .......................................... H03K 17/687
[52] U.S. Cl. .................................. 307/571; 307/264; 307/296 R
[58] Field of Search ............... 307/251, 264, 268, 358, 307/363, 279, 297, 296; 328/48

[56] References Cited

U.S. PATENT DOCUMENTS

| 3,628,070 | 12/1971 | Heuner et al. | 307/251 |
| 3,895,239 | 7/1975 | Alaspa | 307/251 |
| 3,906,254 | 9/1975 | Lane et al. | 307/264 |

Primary Examiner—Stanley D. Miller, Jr.
Assistant Examiner—B. P. Davis
Attorney, Agent, or Firm—Joe E. Barbee

[57] ABSTRACT

A CMOS power on reset circuit is provided which operates with low power supply voltages and yet uses a minimum amount of DC power. The circuit includes a threshold detector which provides an output when the power supply voltage exceeds the transistor threshold voltage by approximately half a volt. A capacitor is connected to the positive power supply terminal to avoid having a narrow output pulse when the power supply rises at a low rate. An output buffer/inverter can be used to provide a better output pulse and to provide a desired output polarity.

6 Claims, 2 Drawing Figures

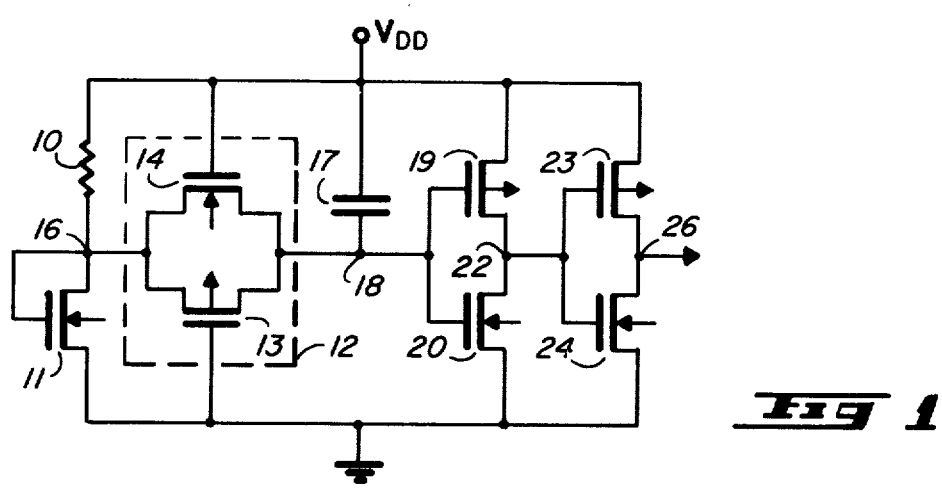
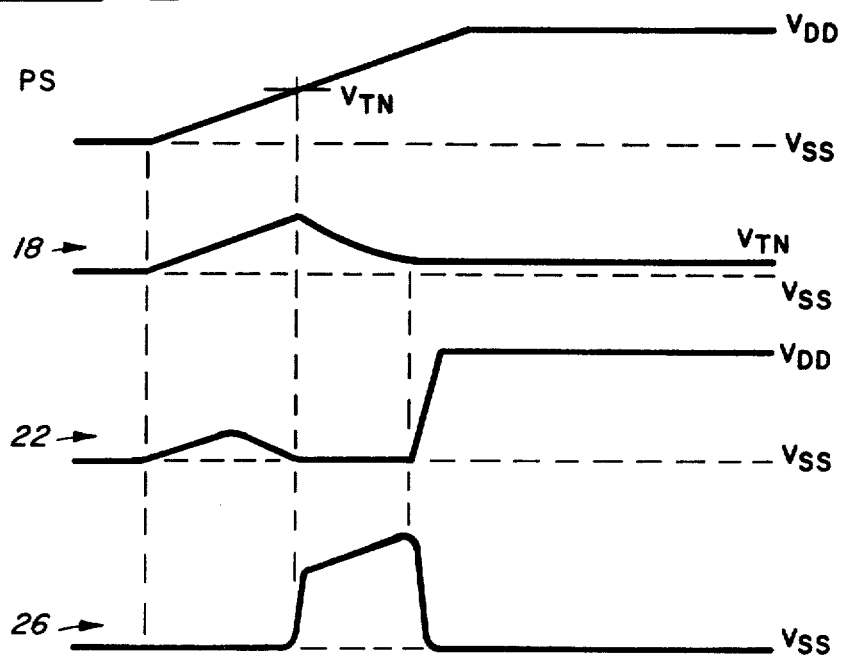

4,300,065

POWER ON RESET CIRCUIT

This invention relates, in general, to power on reset circuits, and more particularly, to a CMOS power on reset circuit capable of operating with low voltage supplies.

In many circuit applications it is desirable to provide a reset pulse as power is applied to the circuit. This is particularly true for digital circuits such as microprocessors. A power on reset circuit will provide an output pulse as the circuit's power supply increases sufficiently to make the circuit operational. In the past, most power on reset circuits would not provide an output pulse until the power supply voltage exceeded the value of two threshold voltages of the field effect transistors used in the circuit. This type of circuit has utility in many applications, however, it is not always suitable for circuits where the power supply is approximately 3 volts. In addition, most power on reset circuits of the past employed a timing capacitor which was connected to circuit ground. The problem with this type of circuit is that when the power supply voltage rises at a slow rate, the output pulse generated will be a very narrow output pulse.

Accordingly, it is an object of the present invention to provide a power on reset circuit capable of operating at low voltage amplitudes.

Another object of the present invention is to provide a power on reset circuit which provides an output pulse which is wide enough to reset digital circuits even when the input voltage rises at a slow rate.

SUMMARY OF THE INVENTION

In carrying out the above and other objects of the present invention there is provided, in one form, a power on reset circuit which provides an output pulse when used in circuits having low power supply voltages. The power on reset circuit has a resistance connected in series with a field effect transistor. The resistance and field effect transistors are connected in series between the positive and reference terminals of the power supply. An output is taken from between the transistor and resistance and is controllably coupled to the input of an inverter. A capacitor is coupled between the input of the inverter and a positive power supply terminal. The output of the inverter is coupled to a second inverter which provides an output for the circuit.

The subject matter which is regarded as the present invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 illustrates, in schematic form, an embodiment of the present invention; and FIG. 2 shows voltage-time waveforms of some of the signals of FIG. 1.

DETAILED DESCRIPTION OF THE DRAWINGS

A power on reset circuit is illustrated in FIG. 1 which will provide an output pulse when the power supply voltage, $V_{DD}$, exceeds the threshold voltage of an N-channel field effect transistor plus half a volt. In addition, there is low power consumption by the circuit and the circuit is AC and DC stable.

A resistor 10 is coupled from power supply terminal $V_{DD}$ to node 16. An N-channel field effect transistor 11 is coupled from node 16 to the power supply reference, illustrated as ground. Transistor 11 has its gate connected to its drain at node 16. Resistor 10 and transistor 11 serve as a threshold detector for the power on reset circuit. The output for the threshold detector appears at node 16. Node 16 is connected to a controllable switch 12 more commonly known as a transmission gate. Controllable switch 12 (enclosed in dotted lines) has a P-channel transistor 13 connected in parallel with an N-channel transistor 14 and provides an output at node 18. It should be noted that controllable switch 12 can be switched end-for-end so what is being called the output can serve as the input and the input can serve as the output without sacrificing performance of the switch. Transistor 14 has its gate electrode connected to voltage terminal $V_{DD}$ and transistor 13 has its gate electrode connected to ground. A capacitor 17 is coupled from voltage terminal $V_{DD}$ to node 18. A first inverter has a P-channel transistor 19 connected in series with an N-channel transistor 20. Each transistor 19 and 20 has its gate electrode connected together to serve as an input for the inverter which is connected to node 18. A node 22 is formed between transistors 19 and 20 and serves as an output for the inverter. A second inverter has a P-channel transistor 23 and an N-channel transistor 24 connected in series between voltage $V_{DD}$ and ground. Gate electrodes of transistors 23 and 24 are connected together to node 22. Output node 26 is formed between transistors 23 and 24.

Transistor 13 may be slightly on when voltage is first applied to the power on reset circuit but will not be fully conductive until node 18 increases in voltage somewhat.

FIG. 2 illustrates some of the time-voltage waveforms useful in understanding the operation of the circuit of FIG. 1. The top waveform labelled PS represents the rise of the power supply voltage when it is first applied to the circuit. Generally because of capacitance loading found in the circuit the power supply voltage will tend to ramp up as opposed to instantaneously changing from zero to full value. The second waveform labelled 18 is a waveform found at node 18 in FIG. 1. The third waveform labelled 22 is a waveform found at node 22 of FIG. 1. And the last waveform labelled 26 is a waveform found at node 26 of FIG. 1. The waveform labelled 26 is the output reset pulse for the circuit of FIG. 1.

The operation of the circuit of FIG. 1 will now be explained. When the power supply voltage is turned on, node 16 will increase in value at the same rate as the power supply voltage until the threshold voltage, $V_{TN}$, of transistor 11 is exceeded. When the threshold of transistor 11 is exceeded transistor 11 will conduct thereby forcing node 16 towards ground. Controllable switch or transmission gate 12 will remain in an inactive state initially, until the power supply voltage rises to a level sufficient to enable transistors 13 and 14. Note that as the voltage at node 16 is increased in value so is the voltage at node 18 which is coupled to the power supply terminal through capacitor 17. When transistor 11 starts to conduct, transmission gate 12 should be enabled by then which will cause node 18 to be pulled towards ground. Since node 18 is coupled to the input of the first inverter it will cause node 22 to go low when node 18 is at its high level and then will cause node 22 to go high when node 18 is pulled to ground. The action of the first inverter will cause an output pulse to appear at output node 26. When node 22 goes low then node 26 will go high and as node 22 is pulled high then node 26 will be pulled low and remain low. The pulse appearing at output node 26 is a reset pulse and customarily will be used for resetting digital circuits associated on the same integrated circuit chip with the power on reset circuit. It should be noted that by connecting capacitor 17 to voltage terminal $V_{DD}$, node 18 is caused to follow $V_{DD}$ as it increases and then to discharge with an RC time constant. If capacitor 18 were tied to ground, which is also known as $V_{SS}$, then node 18 would ramp up having an arching time constant caused by charging current flowing through resistor 10 to capacitor 17, which would result in a very narrow output pulse at output terminal 26. Transmission gate 12 could be eliminated in certain applications, however, it should be noted that the use of the transmission gate adds resistance in the discharge path of capacitor 17 when transistor 11 is enabled. If transmission gate 12 is eliminated the output pulse at node 26 would tend to be narrower.

In a preferred embodiment, the first inverter is skewed meaning that transistor 19 and transistor 20 are not of the same size. By transistors 19 and 20 being of a different physical size no current flow will occur when node 22 reaches or approaches voltage $V_{DD}$ and therefore less power is consumed by the circuit. Since transistor 19 is larger than transistor 20 it will have less resistance and node 22 will approach voltage $V_{DD}$ before node 18 is pulled down. Node 18 will never be pulled all the way to ground but will be within the threshold voltage of transistor 11.

By way of example only, the following values of the circuit components are given:

Resistor 10: 500 K ohms
Transistor 11: 75/10
Transistor 13: 1/10
Transistor 14: 5/10
Capacitor 17: 3 pfd.
Transistor 19: 75/5
Transistor 20: 5/20
Transistor 23: 10/5
Transistor 24: 10/5

The value of the transistors are given as width to length ratios of the transistors in microns.

By now it should be appreciated that there has been provided a power on reset circuit that will provide an output pulse at low power supply voltages and yet consumes a minimum amount of DC power. The circuit illustrated will generate a pulse at output node 26 when voltage $V_{DD}$ approaches approximately 2 volts.

We claim:

1. A power on reset circuit coupled between a first and a second voltage node, comprising: a resistance means having a first and a second end, the first end being coupled to the first voltage node; a field effect transistor having a gate, a drain, and a source, the gate and drain being coupled to the second end of the resistance means, the source being coupled to the second voltage node; a controllable switch having an input and an output, the input being coupled to the second end of the resistance means; a capacitor coupled between the first voltage node and the output of the controllable switch; a first inverter having an input and an output, the input of the first inverter being coupled to the output of the controllable switch; and a second inverter having an input and an output, the input of the second inverter being coupled to the output of the first inverter wherein the controllable switch is a transmission gate.

2. The power on reset circuit of claim 1 wherein the transmission gate has a P-channel field effect transistor and an N-channel field effect transistor connected in parallel and each having a gate, the gate of the P-channel transistor being coupled to the second voltage node, and the gate of the N-channel transistor being coupled to the first voltage node.

3. The power on reset circuit of claim 2 wherein the first and second inverters each have a P-channel field effect transistor connected in series with an N-channel field effect transistor, each transistor having a gate coupled to the input of the respective inverter.

4. A power on reset circuit coupled between a first and a second voltage node, comprising: a resistance means having a first and a second end, the first end being coupled to the first voltage node; a field effect transistor having a gate, a drain, and a source, the gate and drain being coupled to the second end of the resistance means, the source being coupled to the second voltage node; a controllable switch having an input and an output, the input being coupled to the second end of the resistance means; a capacitor coupled between the first voltage node and the output of the controllable switch; a first inverter having an input and an output, the input of the first inverter being coupled to the output of the controllable switch; and a second inverter having an input and an output, the input of the second inverter being coupled to the output of the first inverter, wherein the first and second inverters each have a P-channel field effect transistor connected in series with an N-channel field effect transistor, each transistor having a gate coupled to the input of the respective inverter, and wherein the P-channel field effect transistor of the first inverter is of a larger physical size than the N-channel field effect transistor of the first inverter.

5. A CMOS power on reset circuit coupled between a first and a second voltage node, comprising: a threshold detector having an output; a controllable switch coupled to the output of the threshold detector and having an output; a capacitive means coupled between the output of the controllable switch and the first voltage node; and a first CMOS inverter coupled to the output of the controllable switch and providing an output which becomes a constant output voltage after a predetermined delay from the time that the threshold level has been reached.

6. The CMOS power on reset circuit of claim 5 further including a second CMOS inverter coupled to the output of the first CMOS inverter and providing an output pulse indicating that the power has reached the threshold level.

* * * * *